United States Patent [19]

Lueng

[11] Patent Number: 5,548,288
[45] Date of Patent: Aug. 20, 1996

[54] BICMOS CURRENT CELL AND SWITCH FOR DIGITAL-TO-ANALOG COVERTERS

[75] Inventor: Bosco Lueng, Waterloo, Canada

[73] Assignee: University of Waterloo, Canada

[21] Appl. No.: 174,165

[22] Filed: Dec. 22, 1993

[51] Int. Cl.[6] .................................................. H03M 1/66
[52] U.S. Cl. ........................... 341/136; 341/133; 327/433
[58] Field of Search ................................... 341/133, 134, 341/135, 136; 323/315, 316; 327/432, 433, 538, 540, 541, 543

[56] References Cited

U.S. PATENT DOCUMENTS

| | | | |
|---|---|---|---|
| 4,056,740 | 11/1977 | Schoeff | 341/133 |
| 4,141,004 | 2/1979 | Craven | 341/133 |
| 5,059,890 | 10/1991 | Yoshikawa et al. | 323/315 |

FOREIGN PATENT DOCUMENTS

| | | | |
|---|---|---|---|
| 3-171814 | 7/1991 | Japan | 327/433 |

OTHER PUBLICATIONS

D. Wouter J. Groeneveld, et al., A Self–Calibration Technique for Monolithic High–Resolution D/A Converters, IEEE Journal of Solid State Circuits, 1989, pp. 1517–1522.
Electronics Letters, Dec. 8, 1988, vol. 24, No. 25, pp. 1560–1562.
Electronics Letters, May 11, 1989, vol. 25, No. 10, pp. 644–646.
Bosco H. Leung and Sehat Sutarja, Multibit $\Sigma$–$\Delta$ A/D Converter Incorporating A Novel Class of Dynamic Element Matching Techniques, IEEE, 1992, pp. 35–50.

Feng Chen and Bosco H. Leung, A Multi–Bit $\Sigma\Delta$ DAC with Dynamic Element Matching Techniques, IEEE, 1992, pp. 16.2.1–16.2.4.
Gary Kelson and Hans H. Stellrecht, A Monolithic 10-b Digital–to–Analog Converter Using in Implantation, IEEE, vol. sc8, No. 6 Dec. 1973, pp. 396–403.
Behzad Razavi, High–Speed, High–Resolution Analog–To–Digital Conversion in VLSI Technologies, Integrated Circuits Laboratories, Dec. 1991, pp. 68–75.

*Primary Examiner*—Howard L. Williams
*Attorney, Agent, or Firm*—Knobbe, Martens, Olson & Bear

[57] ABSTRACT

An improved current cell and current switch is described for use in digital-to-analog converters and other current mode circuits. The current switch is implemented using BiCMOS circuitry which is characterized by an absence of base current error and a switching speed which is approximately twice as fast as the switching speed of prior art MOS-based switches. According to one embodiment, the current cell is implemented in BiCMOS which offers higher output resistance, smaller minimum voltage, and improved accuracy over prior art MOS-based self-calibrated current cells. According to another embodiment, the current cell is implemented in CMOS and is characterized by a significant reduction in charge injection, leakage current and error due to coupling of the cell output voltage back to the storage node, as compared with prior art MOS-based current cells. Furthermore, a current-steering digital-to-analog converter is described which incorporates the improved current cell and current switch of the present invention.

18 Claims, 6 Drawing Sheets

Master Bias

BICMOS CURRENT CELL AND SWITCH FOR DIGITAL-TO-ANALOG COVERTERS

FIELD OF THE INVENTION

The present invention relates in general to digital-to-analog converters, and more particularly to a self-calibrating current cell and a current switch for use in a current-steering digital-to-analog converter.

BACKGROUND OF THE INVENTION

Well known current steering digital-to-analog converters (DACs) utilize a plurality of current cells for providing a set of well defined currents (i.e. bit currents) controlled by a digital input code, and a plurality of current switches for selectively switching individual ones of the bit currents generated by the current cells through an output resistor such that the weighted sum of currents passing through the output resistor results in an analogue output voltage proportional to the number of current switches which are enabled (i.e. the number of logic high bits of the digital input code).

MOS-based self-calibrated current cells have been in use in current-steering digital-to-analog converters to copy a reference current to several current cells. This basic technique is attractive because of its simplicity, but suffers from several limitations. These limitations include errors due to charge injection and clock feed-through from the digital switches incorporated in the current cells, leakage current from the switches, finite output resistance due to channel length modulation in the output transistors, etc. Some prior art current cells utilize a cascode device to increase the output resistance of the cell and to reduce the coupling of output back to the storage node of the output transistor. However, it has been found that this approach reduces the available voltage swing for the output transistor.

According to one aspect of the present invention, a CMOS-based current cell is provided having higher output resistance than prior art MOS-based current cells, as well as smaller minimum voltage and improved accuracy.

According to one alternative embodiment of the invention, the self-calibrated current cell is implemented using BiCMOS circuitry.

As discussed above, the constant current generated by respective current cells in a current-steering DAC are selectively switched through the output resistor via respective current switches. Prior art bipolar current switches are known to suffer from error in the output current due to the finite current gain of the bipolar switch transistors. As a result, the output current of these prior art current switches differs from the actual bit current generated by its associated current cell by an amount equal to the base current of the bipolar switching transistor. One prior art approach to minimizing this error is to use a Darlington-connected pair of bipolar transistors. However, this approach tends to significantly degrade the switching speed of the circuit.

On the other hand, MOS-based current switches are known to have the advantage of avoiding non-linearity due to base-current mismatches in prior art bipolar transistor switches. However, the MOS devices have a substantially lower transconductance than the bipolar devices for the same current and area, which means it takes a larger voltage swing at the input to switch the current. Since the bit line which carries the input digital code can be loaded with large parasitic capacitance, the overall switching speed of such prior art MOS-based current switches can be significantly degraded.

Therefore, according to another aspect of the present invention, a BiCMOS current switch is provided having no base current error, and which achieves approximately twice the switching speed when compared to prior art MOS current switches.

BRIEF DESCRIPTION OF THE DRAWINGS

These and other aspects of the invention are discussed in greater detail below with reference to the following drawings, in which.

DETAILED DESCRIPTION OF THE PREFERRED EMBODIMENTS

Figure 1:
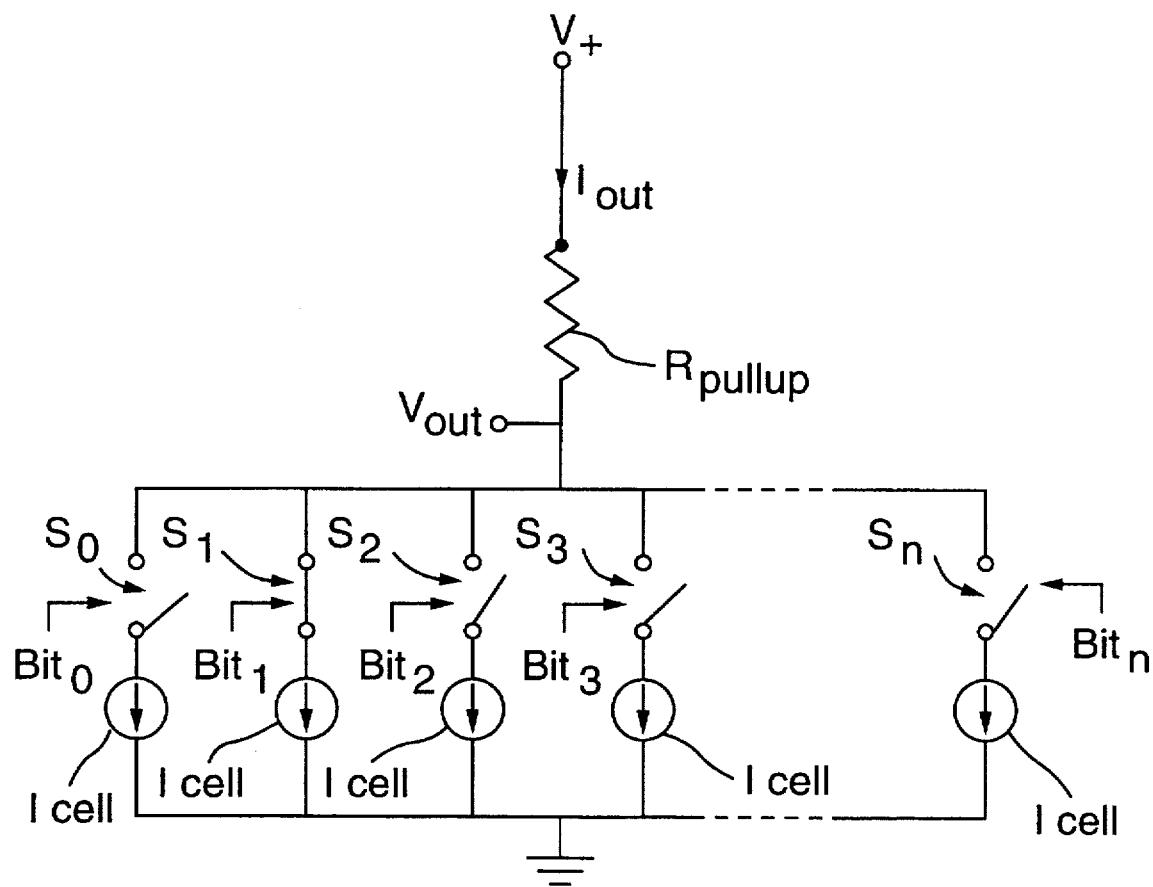
FIG. 1 is a schematic representation of a current-steering digital-to-analog converter according to the prior art.

Turning to FIG. 1, a current steering DAC is shown schematically comprising a plurality of parallel connected current switches $S_0$, $S_1$, $S_2$, $S_3$ . . . $S_n$ which receive respective input bits $Bit_0$, $Bit_1$, $Bit_2$, $Bit_3$ . . . $Bit_n$, and in response selectively switch current from a relative positive power supply voltage ($V_+$) through an output resistor $R_{pullup}$ to a relative negative power supply voltage (e.g. ground), such that the weighted sum of these currents (i.e. $I_{out}$) results in an output voltage $V_{out}$ appearing across resistor $R_{pullup}$. Each of the current switches $S_0$, $S_1$, $S_2$, $S_3$ . . . $S_n$ comprises a transistor switch which is enabled in response to receiving a logic high input bit (i.e. $Bit_0$, $Bit_1$, etc.) and is disabled in response to receiving a logic low input bit. Each transistor switch is connected in series to a current cell ($I_{cell}$) which functions to provide a constant current.

As discussed above, according to the present invention a novel current switch is provided for overcoming the disadvantages of prior art bipolar and MOS-based current switches. Furthermore, in accordance with another aspect of the present invention an improved current cell is incorporated into the current switch of the present invention.

Figure 2:
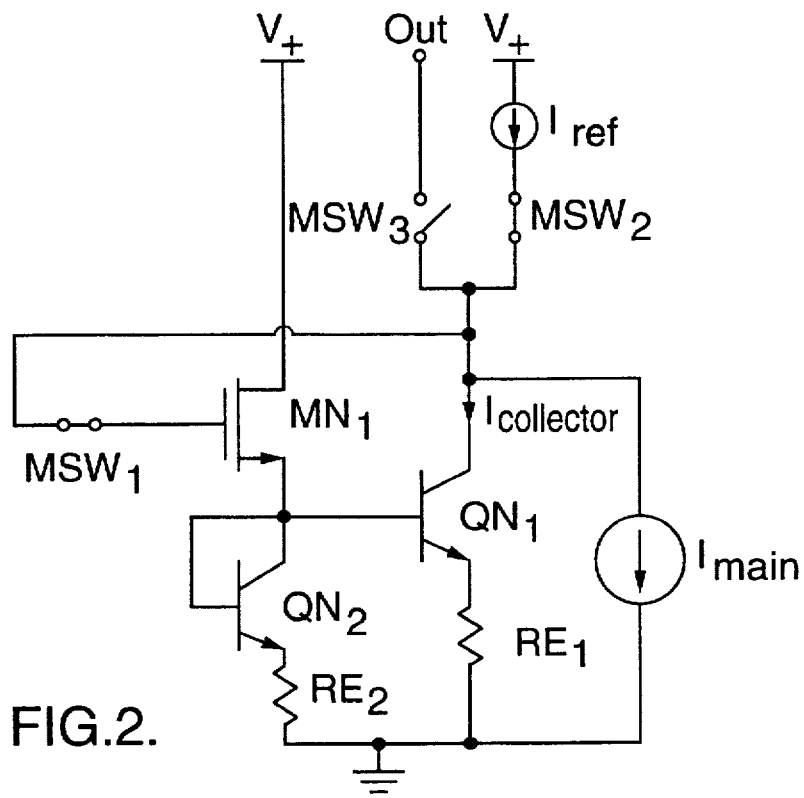
FIG. 2 is a schematic diagram of a BiCMOS self-calibrated current cell according to one aspect of the present invention.

Turning now to FIG. 2, a BiCMOS based current cell is shown according to the present invention.

In operation, switches $MSW_1$ and $MSW_2$ are initially closed and switch $MSW_3$ is open. The difference between the reference current $I_{ref}$ and the collector current $I_{collector}$ of $QN_1$ flows into the gate of $MN_1$ and charges up its gate-source capacitance. Transistor $MN_1$ acts as a source follower with the source resistance equal to the parallel combination of $1/g_{mQN_2}$ and $r_{\pi QN_1}$. As the gate voltage of $MN_1$ increases, the base voltage and hence the collector current of $QN_1$ increases until $I_{collector}=I_{ref}$, thereby completing the calibration process.

Next, switch $MSW_1$ is opened. Since the gate-source capacitance of $MN_1$ is charged up, $MN_1$ continues to operate. Switch $MSW_3$ is then closed and switch $MSW_2$ is opened so that the calibrated current $I_{collector}=I_{ref}$ flows through $MSW_3$ to the output terminal. In this way, the current cell effectively "memorizes" the reference current $I_{ref}$.

Since the drain of $MN_1$ is connected to $V_s$ rather than to the collector of $QN_1$, as in prior art MOS-based current-cells, the minimum output voltage swing is $V_{CE(sat)QN_1}$ instead of $V_{BE_{QN_1}}+V_{GS_{MN_1}}$ during operation. During calibration, the voltage at the collector of $QN_1$ is $V_{BE_{QN_1}}+V_{GS_{MN_1}}$. By using the level shifter $QN_2$, the collector voltages between calibration and operation can be set close to each other thereby minimizing the voltage variation effect. In accordance with this aspect the minimum voltage swing of the cell is $V_{CE(sat)}$. Compared to prior art MOS-based self-calibrated current cells, the current cell of the present invention provides higher output resistance $R_{out}$. Also, the swing voltage is limited by $V_{CE(sat)}$, not $V_{DSsat}$. Finally, the capacitance $C_{bc}$ of $QN_1$ has a much lower value than $C_{gd_{MN_1}}$. Consequently, the induced voltage due to output variation is reduced over the prior art. Lower capacitance also translates into faster switching of the current switches as discussed in greater detail below.

One potential problem which results from introducing the bipolar transistor $QN_1$ into the current cell results comes from the $g_m$ value (i.e. transconductance). Without $QN_2$ in the circuit, the $\Delta V$ caused by charge injection and leakage current would be transmitted almost unattenuated by the source follower $MN_1$ and multiplied by $g_{mQN_1}$. Since $g_{mBJT} \gg g_{mMOS}$, this would result in a large current error. With the diode-connected bipolar transistor $QN_2$ in the circuit, the source resistance $R_s$ of $MN_1$ is reduced to approximately $1/g_{mQN_2}$. Hence the gain of the source follower is $$A_v = \frac{g_{m_{MN1}} R_s}{1 + g_{m_{MN1}} R_s} \approx \frac{g_{m_{MN1}}}{g_{m_{QN2}}}$$

because $g_{m_{QN_2}} \gg g_{m_{MN_1}}$. The current error becomes $$\Delta I = \left( \frac{g_{m_{MN1}}}{g_{m_{QN2}}} g_{m_{QN1}} \right) \Delta V.$$

As in the case of prior art MOS implementations, this current error is further reduced in the present invention by the addition of a parallel current source $I_{main}$ of about 90% of the reference current $I_{ref}$. One implementation of the parallel current source consists of a bipolar transistor in parallel with $QN_1$ which has 9 times the emitter area. With only 10% of the reference current, the $g_m$ of $QN_1$ and $QN_2$ are both reduced by a factor of 10 and the $g_m$ of $MN_1$ is reduced by $\sqrt{10}$. Hence, the transconductance of the overall stage is reduced by $\sqrt{10}$. As in the prior art MOS case, the size of $MN_1$ can be optimized to reduce the W/L for the same $V_{DSsat}$, resulting in a final reduction of the overall transconductance by a factor of 8 while keeping $C_{gs}$, of $MN_1$ constant.

Another advantage resulting from the inclusion of transistor $QN_2$ stems from the extra isolation between the output node (Out) and $MN_1$. In this regard, it should be noted that $QN_2$ provides a low impedance point at the source of $MN_1$ whose impedance is roughly $1/g_{m_{QN_2}}$. This low impedance node serves to attenuate the coupling of any output voltage variation back to $C_{gs_{MN_1}}$.

Since the high $g_{m_{QN_1}}$ can still cause problems due to noise, particular if wide-band noise becomes a critical issue for the resolution requirement, then according to the preferred embodiment, $QN_1$ is emitter degenerated by resistor $R_{E_1}$ to reduce the noise effect, although at the expense of reduced voltage swing. To properly define the current $I_{QN_2}$, resistor $R_{E_2}$ having the same resistance as $R_{E_1}$ is connected between the emitter of $QN_2$ and ground. It should be noted that as a result, $R_s$ for $MN_1$ is increased to $1/g_{m_{QN_2}}+R_{E_2}$, resulting in an increase of $A_v$. However, since $G_m$ of the $QN_1$ stage is reduced through degeneration, $\Delta I$ remains approximately the same. In addition since $R_{E_1}$ and $R_{E_2}$ are inside the calibration loop, their matching requirement is substantially reduced.

Figure 3:
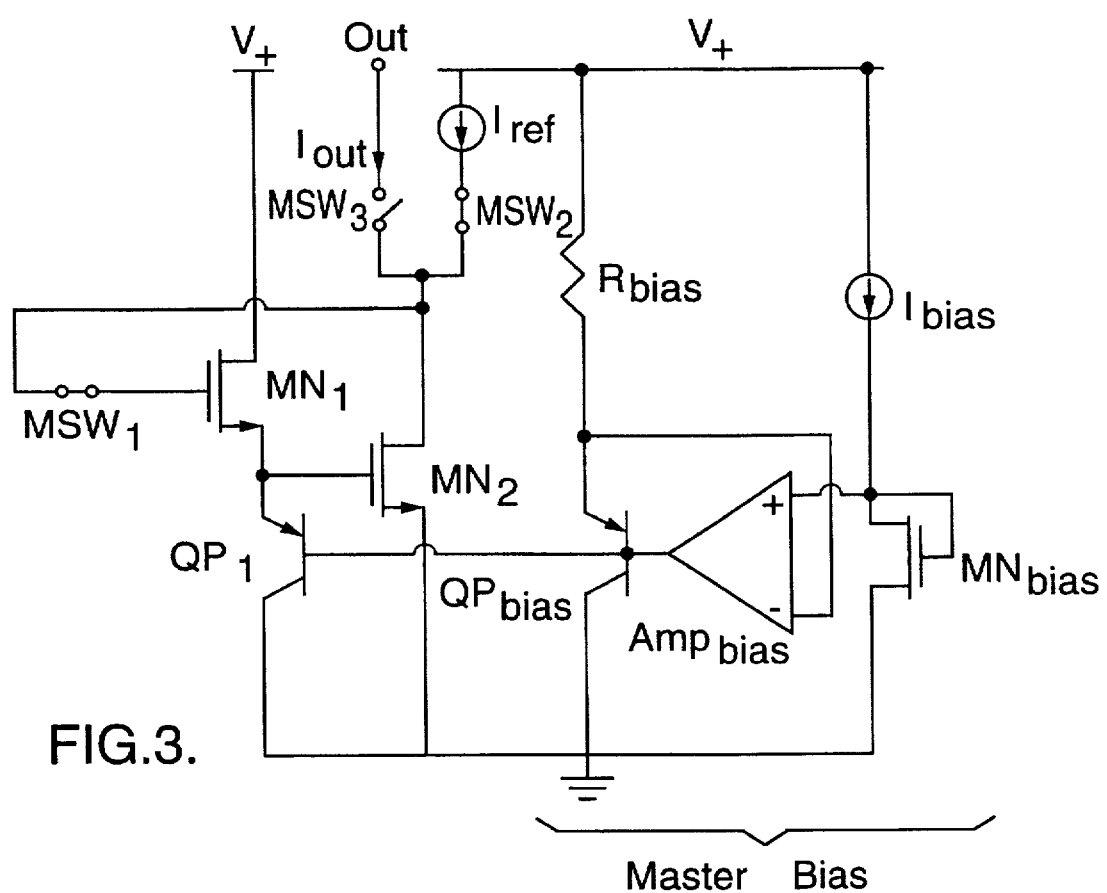
FIG. 3 is a schematic diagram of a CMOS current cell according to a further aspect of the present invention.

Turning now to the alternative embodiment of CMOS based current cell shown in FIG. 3, when the switches $MSW_1$, $MSW_2$ and $MSW_3$ are operated as shown, the difference between the reference current $I_{ref}$ and the drain current of $MN_2$ flows into the gate of $MN_1$ and charges up its gate-source capacitance. Transistor $MN_1$ acts as a source follower with source resistance approximately equal to $$\frac{1}{gm}$$

of $QP_1$, which is the substrate PNP transistor available as a parasitic in the standard CMOS process. As the gate voltage of $MN_1$ increases, the drain current of $QN_1$ increases until the drain current of $MN_2$ equals that reference current, thereby completing the calibration process.

An extra stage formed by the MOS transistor $MN_1$ and the PNP transistor $QP_1$ is introduced between the $MSW_1$ and the output transistor $MN_2$. During calibration, it acts as level shifter.

When $MSW_1$ is opened, the charge injection and clock feed through from the switch changes the gate-source voltage of $MN_1$. This $\Delta V_{gs}$ is now attenuated by the source follower with degeneration. The gain of the source follower is given by:

$$A_v = \frac{gm R_s}{1 + gm R_s} \approx \frac{g_{mMN1}/g_{mQP1}}{1 + g_{mMN1}/g_{mQP1}} \approx \frac{g_{mMN1}}{g_{mQP1}}$$

which is about $\frac{1}{40}$ to $\frac{1}{10}$ depending on the current because $g_{MN_1} \ll g_{mQP_1}$ for the same bias current. The resulting error in current is reduced and is given by:

$$\Delta I_{out} = \frac{g_{mMN1}}{g_{mQP1}} \times g_{mMN2} \times \Delta V_g.$$

The master bias circuit provides the proper base bias for the PNP transistor $QP_1$. In addition, the emitter of $QP_1$ provides a low impedance point and so any coupling from the output is attenuated. The PNP transistor $QP_{bias}$ is available in a standard CMOS process as a substrate PNP in an N-well process or alternatively as a substrate NPN in a P-well process.

One of the advantages of the CMOS-based current cell of FIG. 3 is improved accuracy over prior art current cells. The extra attenuation stage decouples output voltage variations from the charge storage node as well as significantly reducing the effect of charge injection, clock feed-through and leakage current from the MOS switch $MSW_1$. The absolute and relative errors are less than prior art designs.

Figure 4A:
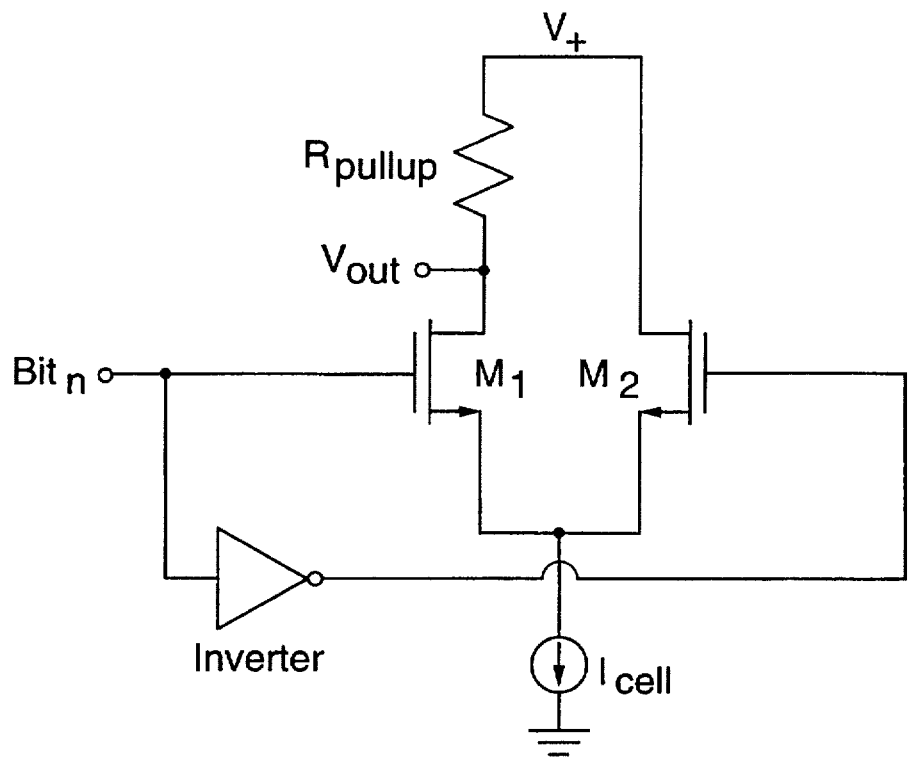
FIG. 4A is a schematic diagram of a prior art CMOS current switch.

In order to benefit from the cost advantages and power savings of the CMOS based current cell of FIG. 3 in a current-steering digital-to-analog converter, the associated current switch should be fabricated using CMOS components. With reference to FIG. 4A, a suitable MOS-based current switch is shown according to the prior art. This particular current switch is disclosed in B. Rasafi "High-Speed, High Resolution Analog-to-Digital Conversion in VLSI Technologies", Ph.D. Dissertation, Stanford University, Stanford, Calif., pages 68–75, December 1991. In response to receiving a logic high input $Bit_n$, MOS transistor $M_1$ is enabled for conducting the bit current $I_{cell}$ through $R_{pullup}$ in a well known manner. As discussed, the bit current is preferably generated by the CMOS current cell of the present invention as depicted in FIG. 3. In response to receiving a logic low $Bit_n$, transistor $M_1$ is disabled and transistor $M_2$ is enabled so that the bit current flows from $V_+$ through transistor $M_2$ and ceases to flow through $R_{pullup}$.

The relative merits and disadvantages of using prior art MOS-based current switches is discussed in detail in the Background of Invention for this application.

Figure 4B:
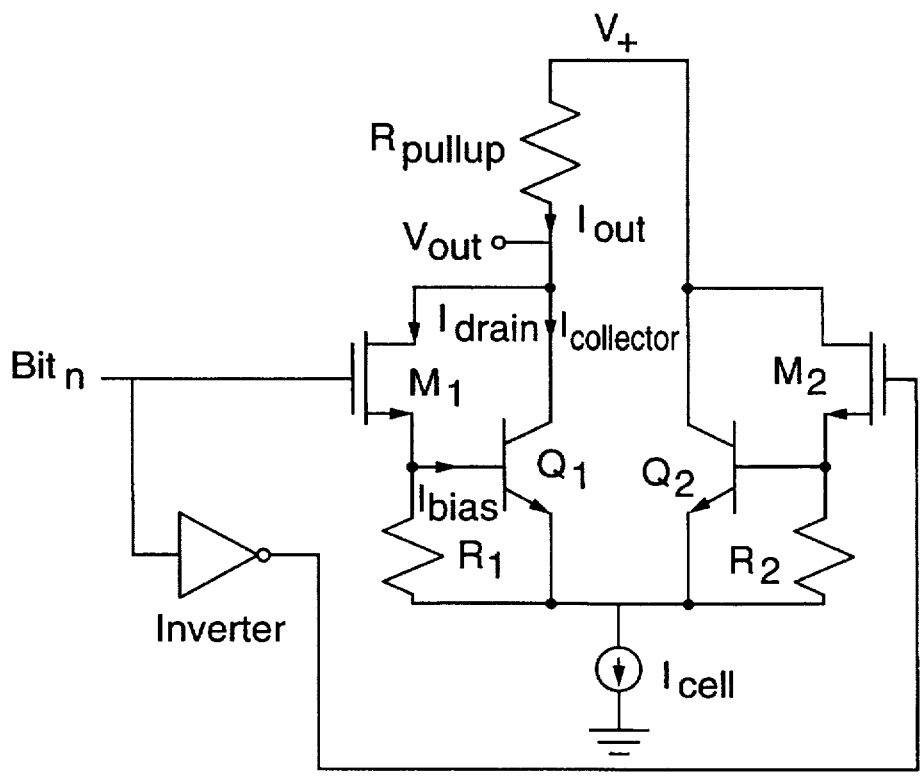
FIG. 4B is a schematic diagram of a BiCMOS current switch according to yet another aspect of the present invention.

Turning finally to FIG. 4B, a BiCMOS based current switch is shown in which resistors $R_1$ and $R_2$ are used to pull down the base nodes of transistors $Q_1$ and $Q_2$. Since the resistors $R_1$ and $R_2$ are connected to the emitters of $Q_1$ and $Q_2$ rather than to ground, the voltage swing at the bases of $Q_1$ and $Q_2$ is reduced. In order to ensure proper switching, the voltage swing has to be at least $V_{DSsat}+V_{BE}$, which can be generated by a level-shift stage.

As an example, assume that W/L of all of the MOS transistors in FIG. 4B is 4 μm/0.8 μm. The bipolar transistors $Q_1$ and $Q_2$ have an emitter area of 0.8 μm×4 μm. The cell current is 0.35 mA and the pull-up resistor $R_{pull-up}$ has a value of 1.43 kΩ. $R_1$ and $R_2$ are both 20 kΩ.

To understand the operation of the current switch of FIG. 4B assume $V_+$=5 V. Furthermore, assume $Bit_n$ is at logic high or 3 V. Then, transistor $M_1$ turns on and $M_2$ is off. The base of $Q_2$ is short-circuited to the emitter thereby turning of $Q_2$. The base of $Q_1$ is pulled up to $3\ V - V_{GS}$. The emitter of $Q_2$ is at $3\ V-V_{GS}-V_{BE}$. The source of $M_2$ is at the same voltage since $V_{R2}$ is zero. To ensure that $M_2$ is off, its gate has to be less than one $V_T$ higher than this voltage of $V_{GM2}$<3 $V-V_{GS}-V_{BE}+V_T$=3 $V-V_{DSsat}-V_{BE}$=1.5 V. This defines the logic low level.

The current $I_{cell}$ is now steered toward $Q_1$. The output current $I_{out}$ then consists of the current $I_{R1}$ through resistor $R_1$ and the emitter current $I_{emitter}$ of $Q_1$. Since the base current $I_{base}$ is returned via $M_1$ to the output, no error results due to the finite β of $Q_1$, contrary to the prior art bipolar implementations.

The value of 3 V is selected as logic high on the one hand to give enough voltage headroom to the current cell and on the other hand to make sure that $M_1$ does not go into the triode region of operation. The current flowing through $R_1$ and $R_2$ should be chosen to be approximately 1/10 of $I_{cell}$. This value results in most of the current switching being performed through the high speed emitter-coupled pair, yet ensures that the transistors $M_1$ and $M_2$ have sufficient bias current, hence enough speed.

A summary of the simulated switching delay versus different input rise and fall times is given in Table 1, where it is seen that the BiCMOS-based current switch enjoys almost a factor of 2 in improved average delay for an input ramp of 5 V/ns. In addition the switching delay of the BiCMOS switch is relatively insensitive to the ramp time of the input waveform, while the MOS delay increases with an increase in the input rise and fall times.

TABLE I

| | SWITCHING DELAY VERSUS INPUT WAVEFORM $I_{cell} = 0.35\ m.A.\ R_{pull-up} = 1.43\ kΩ$ | | | | | |
|---|---|---|---|---|---|---|
| | BiCMOS | BiCMOS | BiCMOS | MOS | MOS | MOS |
| Input Ramp Time | Rise Time | Fall Time | Avg | Rise Time | Fall Time | Avg |
| 10 V/ns | 0.32 ns | 0.19 ns | 0.255 ns | 0.33 ns | 0.30 ns | 0.315 ns |
| 5 V/ns | 0.37 ns | 0.18 ns | 0.275 ns | 0.46 ns | 0.45 ns | 0.455 ns |

Test Results

Figure 5A:
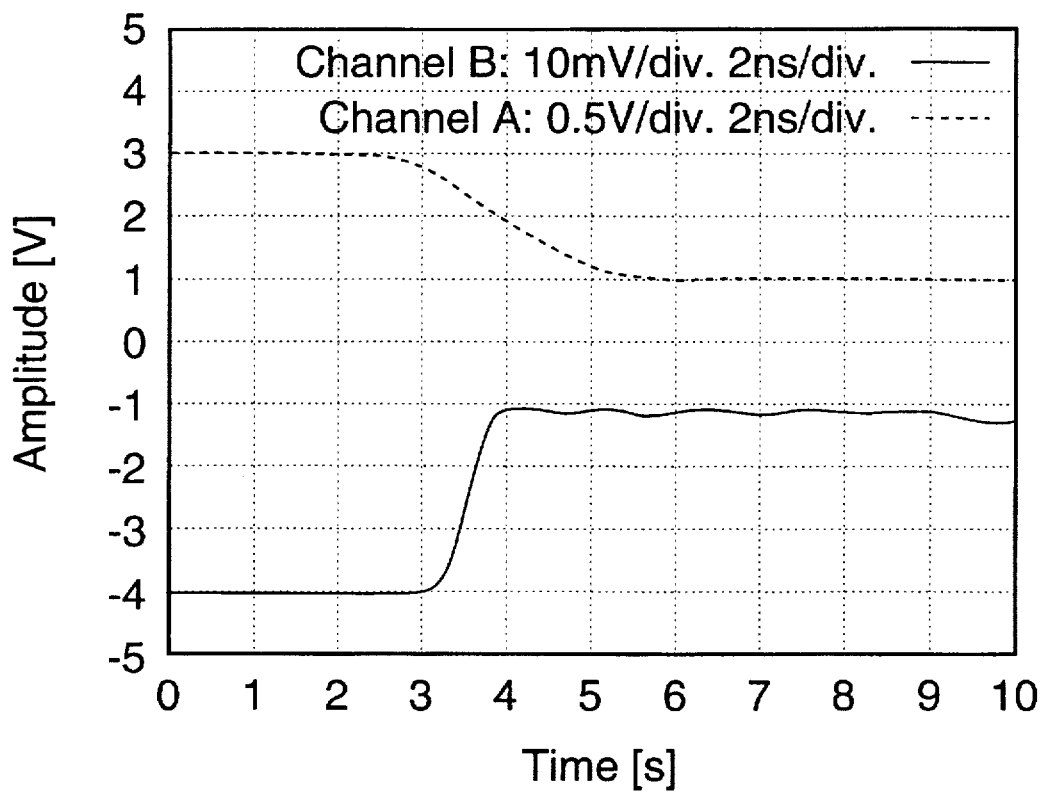
FIGS. 5A and 5B show the measured rise time and fall time, respectively, for the BiCMOS based current steering switch of FIG. 4B.
Figure 5B:
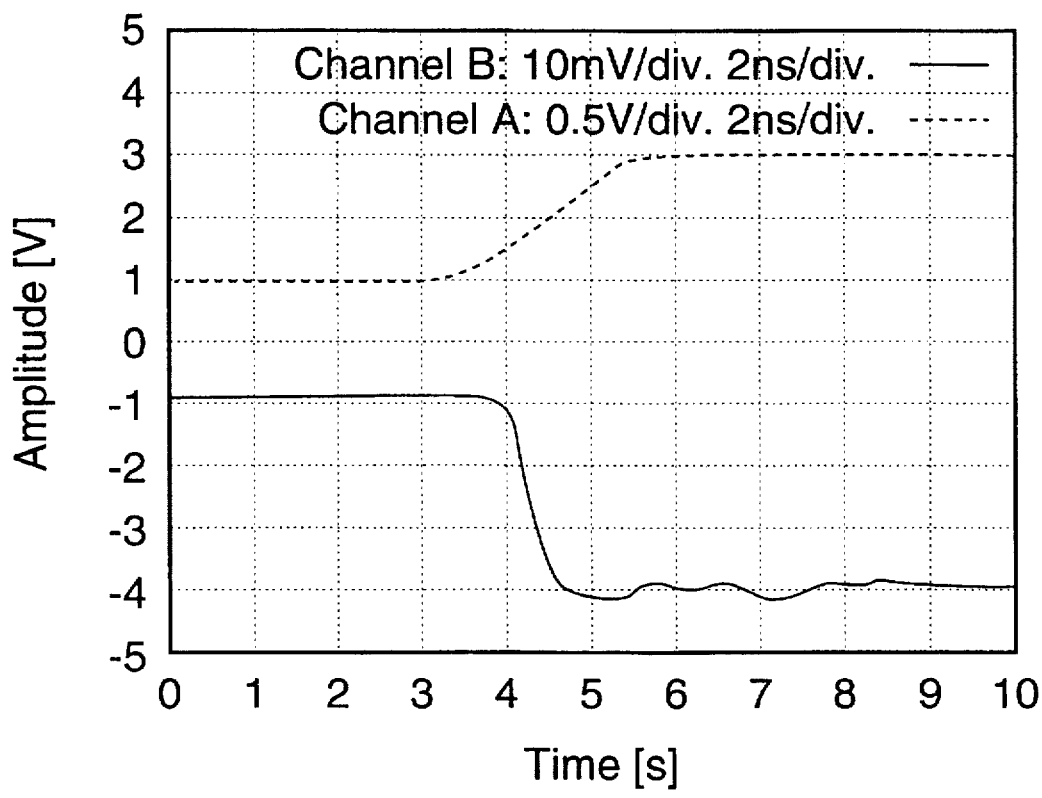

The BiCMOS current switch of FIG. 4B was fabricated using a 0.8 μm by BiCMOS process and tests were conducted which established that the 10%–90% transition time at the output of the switch is less than one nanosecond. The test set-up was as follows: a differential pulse generator was used to provide the BiCMOS current switch with an input waveform. The current output of the switch was probed with a microprobe and then taken to a 50 ohm oscilloscope input through a matched coaxial line. The 50 ohm internal scope termination served as a load resistor for the output current and the voltage change across the resistor was observed. FIGS. 5A and 5B show the rise time and the fall time, respectively, of the BiCMOS current switch of FIG. 4B for an input having a transition time of 4 nanoseconds. It can be seen from these Figures that both the rise time and the fall time of the switch are approximately 1 nanosecond.

Figure 6:
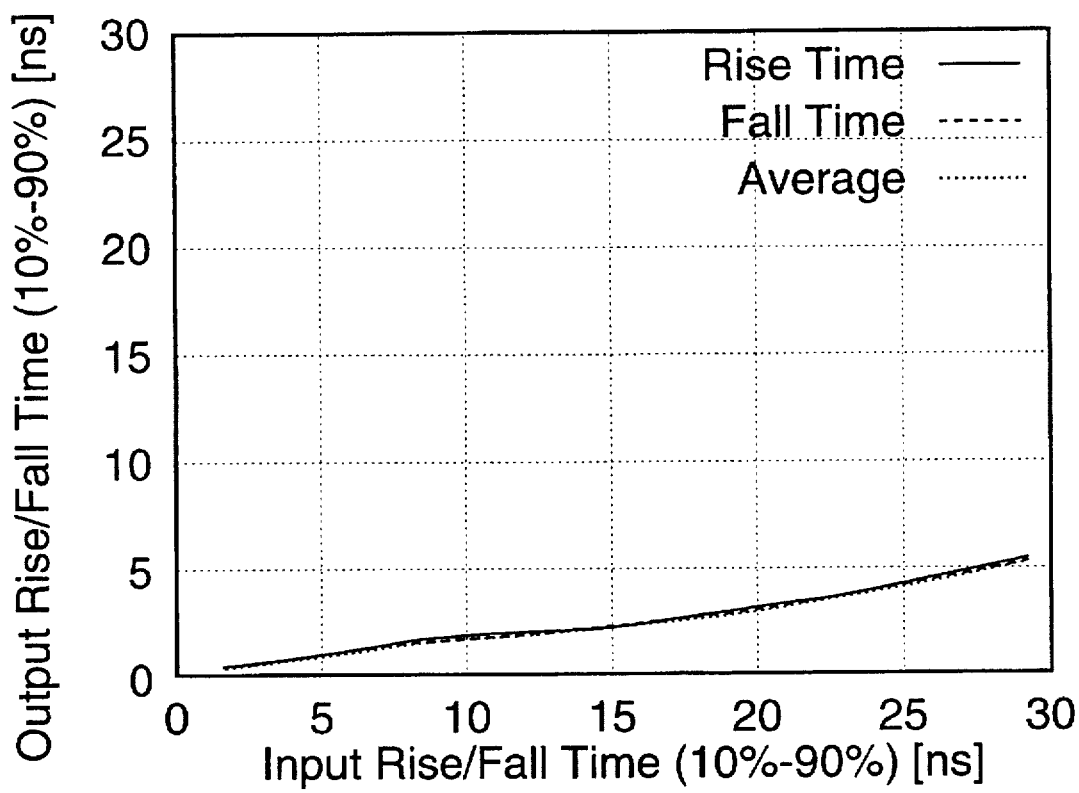
FIG. 6 shows the measured rise time and fall time versus input transition time for the BiCMOS based current steering switch of FIG. 4B.

FIG. 6 is a plot of the rise and fall times of the BiCMOS current switch of FIG. 4B versus the transition time of the input. From this, it can be seen that the switching time of the current switch according to the present invention is very insensitive to the switching time of the input waveform. This is a significant advantage over the simple prior art MOS current switch which is characterized by a linear relationship between input transition time and output transition time. The BiCMOS switch of the present invention therefore operates extremely quickly even if the input line is loaded with significant parasitic capacitance and is slow to change.

A BiCMOS current cell as shown in FIG. 2 was also fabricated in a 0.8 μm BiCMOS process and test results indicate that the absolute error of the cell is under 1% from 10 μm to 100 μm. Preliminary tests indicate that the relative accuracy at the centre of this current range is at about the 13 bit level.

Figure 7:
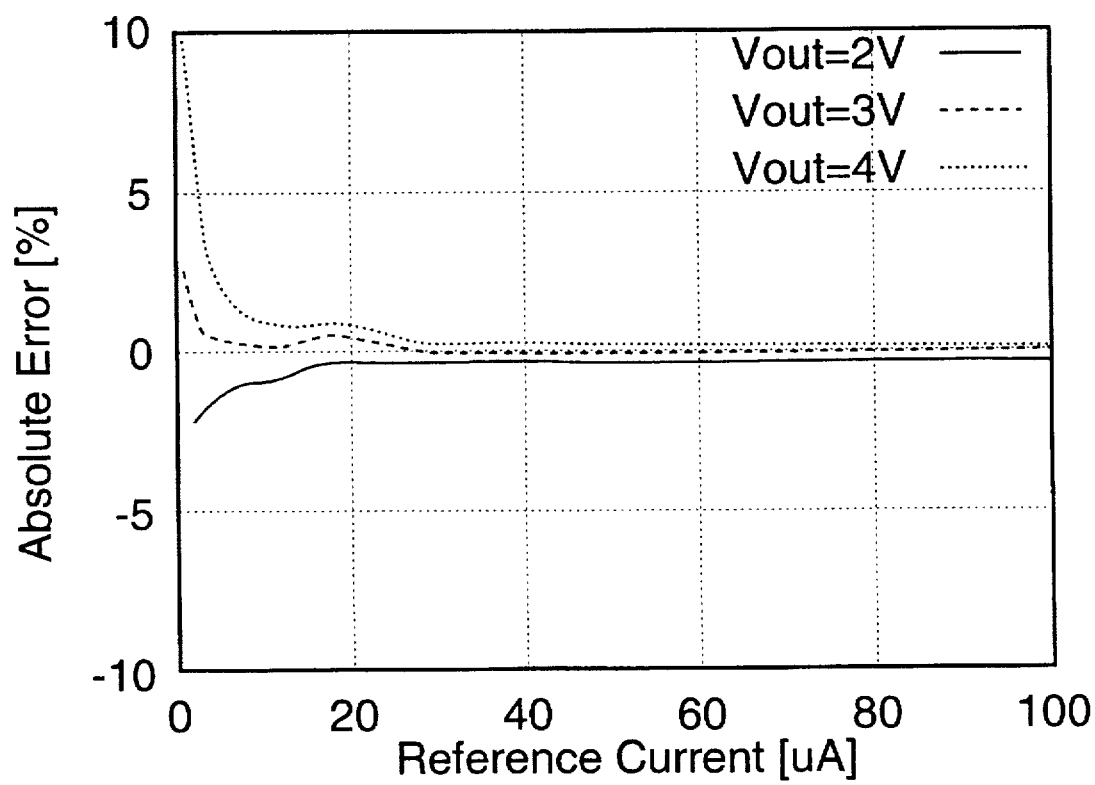
FIG. 7 shows measured absolute error versus reference current ($I_{ref}$) for the BiCMOS based current cell of FIG. 2.

FIG. 7 is a plot of the absolute error versus reference current for three different cell output voltages. From this graph it can be seen that the error is well under 1% over almost the entire current range.

Turning finally to the CMOS based current cell of FIG. 3, this cell was simulated using HSPICE, with the BSIM model for the MOS transistors. The simulations were performed using a 1.2 micron CMOS process. The calibration rate was 100 kHz. $QP_1$ was simulated as a substrate PNP transistor with minimum geometry and a $\beta$ of 20.

Figure 8A:
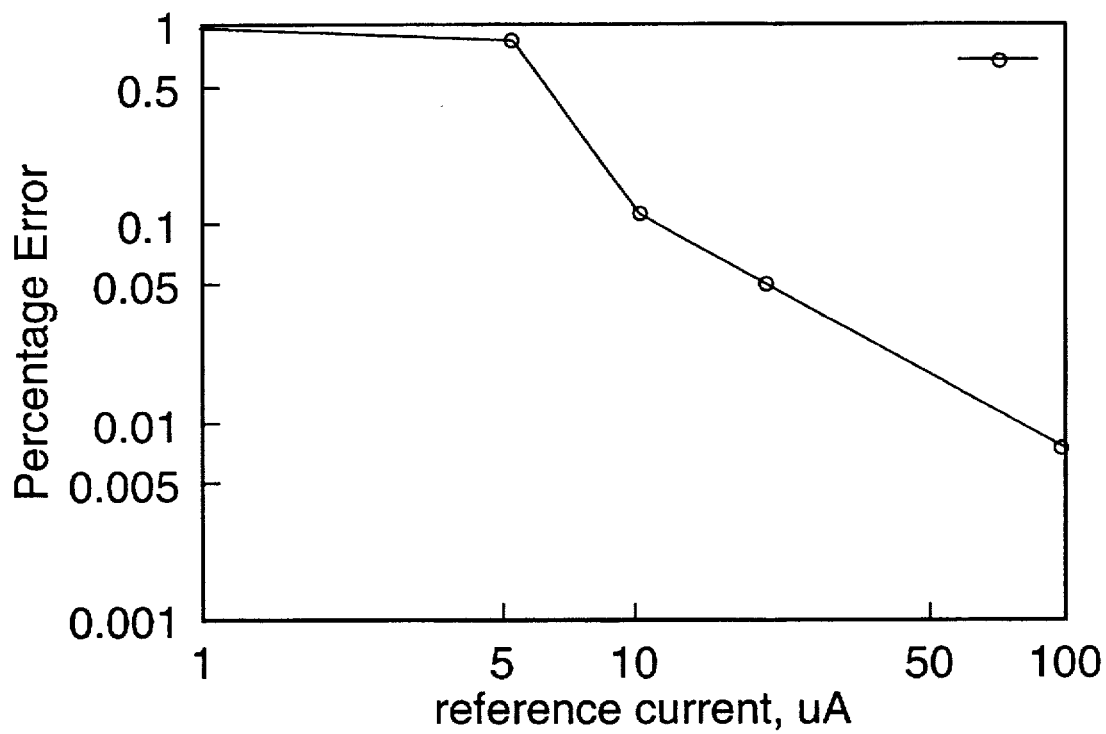
FIGS. 8A and 8B show the simulated absolute accuracy and relative error, respectively, of the CMOS-based current cell of FIG. 3.

FIG. 8A shows a plot of absolute accuracy of the CMOS based current cell. The absolute error is defined as $$e_{abs} = \frac{I_{out} - I_{ref}}{I_{ref}}$$

where $I_{out}$ is defined as the current available at the output terminal after the calibration cycle. The error is less than 1% from a range of 1–100 µA and shows roughly a factor of two improvement over previous MOS based designs.

Figure 8B:
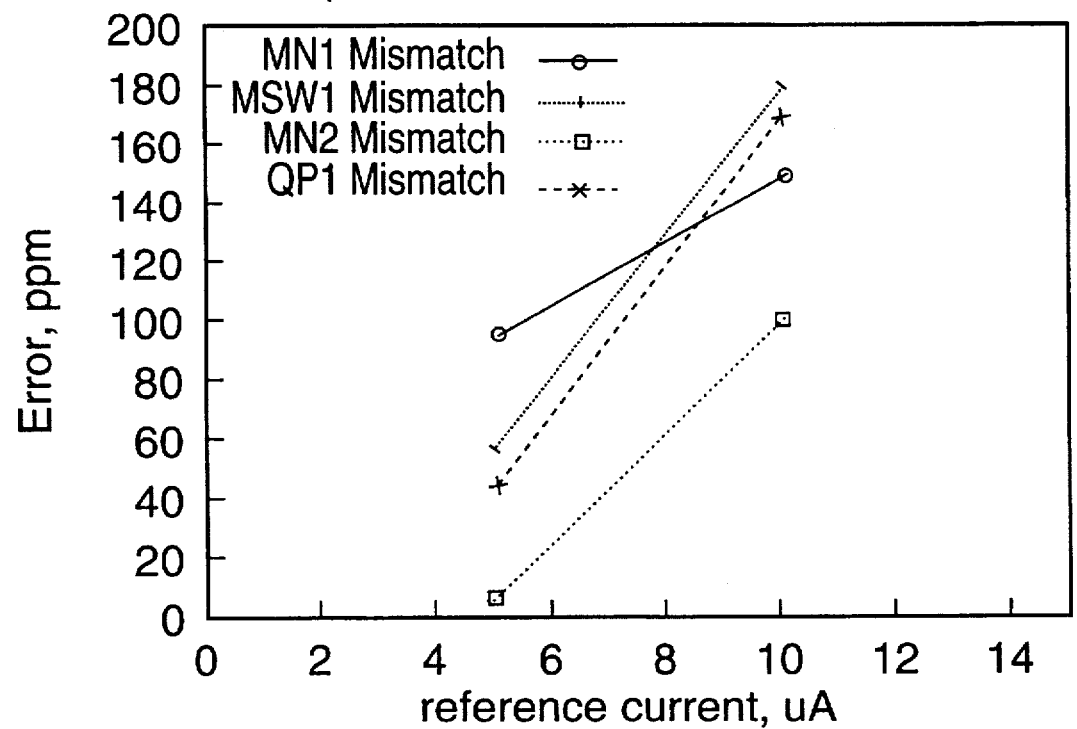

FIG. 8B is a plot of the relative error in ppm (parts per million) versus the reference current for different sources of mismatch. The relative error is defined as:

$$e_{rel} = \frac{I_{1\%} - I_{nominal}}{I_{nominal}}$$

where $I_{1\%}$ is the output current when a 1% mismatch is introduced into one of the cell elements and $I_{nominal}$ is the output current of a nominal ideal cell. The maximum relative error in this current range is around 180 ppm, and is smaller than prior art designs.

In summary, an improved current cell and improved current switch are disclosed herein, which in one embodiment are both based on BiCMOS technology, and in another embodiment the current cell is based on CMOS technology. The current cell is characterized by a factor of approximately 2 in improved accuracy over conventional MOS self-calibrated cells. The current switch has none of the $\beta$ mismatch problems that are encountered in bipolar based current switches. The current switch also enjoys a factor of almost 2 in improved switching speed over prior art MOS based current switches. The CMOS based self-calibrated current cell of the present invention benefits from similar advantages as the BiCMOS embodiment and is characterized by extremely high accuracy due to the extra attenuation stage which decouples the output voltage variations from the charge storage node.

Alternative embodiments and modifications are possible. For example, the current cell of the present invention has applications other than in current-steering digital-to-analog converters. The current cell may be used in other current mode circuits such as switched current signal processing circuits, current mode oversampled A/D, D/A converters etc. All such embodiments and modifications are believed to be within the sphere and scope of the present invention as defined by the claims appended hereto.

I claim:

1. A current steering digital-to-analog converter for generating an analog output voltage in response to receiving a digital input code, comprising:

(a) relative positive and relative negative power supply voltages;

(b) a pull-up resistor connected to said relative positive power supply voltage;

(c) an output terminal connected to said pull-up resistor for outputting said analog output voltage, wherein said analog output voltage is developed across said pull-up resistor in proportion to output current flowing therethrough;

(d) a plurality of current switches for receiving respective bits of said digital input code and in response selectively switching current from said relative negative power supply voltage through said pull-up resistor such that said output current results from the sum of currents switched through individual ones of said current switches;

wherein each one of said plurality of current switches further comprises an inverter for receiving one of said respective bits of said digital input code and in response generating an inverted version thereof, a current cell for generating a constant bit current from said relative negative power supply voltage, a first BiCMOS pair of transistors for receiving said one of said respective bits of said digital input code and switching said constant current through said pull-up resistor in the event said one of said respective bits of said digital input code is logic high, and a second BiCMOS pair of transistors for receiving said inverted version of said one of said respective bits of said digital input code and switching said constant current to said relative positive power supply voltage in the event said inverted version of said one of said respective bits of said digital input code is logic high;

wherein said current cell further comprises:

(e) a source of constant reference current connected to said relative positive power supply voltage;

(f) an output connected to said first and second BiCMOS pairs of transistors;

(g) a MOS transistor having a drain terminal connected to said relative positive power supply voltage, and gate and source terminals;

(h) first switch means connected to said source of constant reference current;

(i) second switch means connected to said output and said first switch means;

(j) third switch means connected to said gate terminal and said first and second switch means;

(k) first circuit means configured as a level shifter and connected to said source terminal of said MOS transistor and to said relative negative power supply voltage; and (l) second circuit means configured as a current calibrator connected to said source terminal of said MOS transistor, to said first circuit means, to said relative negative power supply voltage and to said first, second and third switch means;

whereby (i) in response to said first and third switch means being closed and said second switch means being open said MOS transistor is enabled which in response enables said second circuit means for conducting said constant reference current, and (ii) in response to said first switch and third switch means then being opened and said second switch means being closed said MOS transistor remains enabled, said second circuit means conducts said constant reference current through said second switch means to said output and said first circuit means is enabled for minimizing voltage variation at said output in response to opening said first and third switch means and closing said second switch means.

2. The current-steering digital-to-analog converter of claim 1, wherein said first circuit means comprises m) a first resistor connected to said relative negative power supply voltage; and n) a first NPN transistor having a collector terminal connected to said source terminal of said MOS transistor, a base terminal connected to said collector terminal and an emitter terminal connected to said first resistor.

3. The current-steering digital-to-analog converter of claim 2, wherein said second circuit means comprises:

o) a second resistor connected to said relative negative power supply voltage;

p) a second NPN transistor having a collector terminal connected to said first, second and third switch means, a base terminal connected to said source terminal of said MOS transistor and said collector terminal of said first NPN transistor, and an emitter terminal connected to said second resistor; and q) a further current source connected in parallel with said second resistor and said second NPN transistor.

4. The current-steering digital-to-analog converter of claim 1, wherein said first circuit means comprises a first substrate parasitic bipolar transistor having a collector terminal connected to said relative negative power supply voltage, a base terminal connected to said second circuit means and an emitter terminal connected to said source terminal of said MOS transistor.

5. The current-steering digital-to-analog converter of claim 4, wherein said second circuit means comprises:

m) a first resistor connected to said relative positive power supply voltage;

n) a second substrate parasitic transistor having a collector terminal connected to said relative negative power supply voltage, a base terminal connected to said base terminal of said first substrate parasitic transistor, and an emitter terminal connected to said first resistor;

o) an operational amplifier having an output connected to the base terminal of said second substrate parasitic transistor, and inverting and non-inverting inputs, said inverting input being connected to said emitter terminal of said second substrate parasitic transistor;

p) a second MOS transistor having a drain terminal connected to said first, second and third switch means, a gate terminal connected to said emitter terminal of said first substrate parasitic transistor, and a source terminal connected to said relative negative power supply voltage;

q) a further current source connected to said relative positive power supply voltage; and r) a third MOS transistor having a drain terminal connected to said further current source, a gate terminal connected to the non-inverting input of said operational amplifier and a source terminal connected to said relative negative power supply voltage.

6. A current steering digital-to-analog converter for generating an analog output voltage in response to receiving a digital input code, comprising:

(a) relative positive and relative negative power supply voltages;

(b) a pull-up resistor connected to said relative positive power supply voltage;

(c) an output terminal connected to said pull-up resistor for outputting said analog output voltage, wherein said analog output voltage is developed across said pull-up resistor in proportion to output current flowing therethrough;

(d) a plurality of current switches for receiving respective bits of said digital input code and in response selectively current from said relative negative power supply voltage through said pull-up resistor such that said output current results from the sum of currents switched through individual ones of said current switches;

wherein each one of said plurality of current switches further comprises an inverter for receiving one of said respective bits of said digital input code and in response generating an inverted version thereof, a current cell for generating a constant bit current from said relative negative power supply voltage, a first BiCMOS pair of transistors for receiving said one of said respective bits of said digital input code and switching said constant current through said pull-up resistor in the event said one of said respective bits of said digital input code and switching said constant current through said pull-up resistor in the event said one of said respective bits of said digital input code is logic high, and a second BiCMOS pair of transistors for receiving said inverted version of said one of said respective bits of said digital input code and switching said constant current to said relative positive power supply voltage in the event said inverted version of said one of said respective bits of said digital input code is logic high;

wherein said first BiCMOS pair of transistors further comprises:

(e) an additional resistor connected to said current cell;

(f) a bipolar transistor having a collector terminal connected to said output terminal, an emitter terminal connected to said current cell, and a base terminal connected to said additional resistor; and (g) a MOS transistor having a drain terminal thereof connected to said output terminal, a source terminal thereof connected to said additional resistor and said base terminal, and a gate terminal for receiving said one of said respective bits of said digital input code and in response selectively conducting said constant bit current through said pull-up resistor and said additional resistor to said current cell via a drain-source channel of said MOS transistor, whereby the base-emitter junction of said bipolar transistor becomes forward biased causing a portion of said constant bit current to flow through said pull-resistor and said bipolar transistor to said current cell.

7. A current steering digital-to-analog converter for generating an analog output voltage in response to receiving a digital input code, comprising:

(a) relative positive and relative negative power supply voltages;

(b) a pull-up resistor connected to said relative positive power supply voltage;

(c) an output terminal connected to said pull-up resistor for outputting said analog output voltage, wherein said analog output voltage is developed across said pull-up resistor in proportion to output current flowing therethrough;

(d) a plurality of current switches for receiving respective bits of said digital input code and in response selectively switching current from said relative negative power supply voltage through said pull-up resistor such that said output current results from the sum of currents switched through individual ones of said current switches;

wherein each one of said plurality of current switches further comprises an inverter for receiving one of said respective bits of said digital input code and in response generating an inverted version thereof, a current cell for generating a constant bit current from said relative negative power supply voltage, a first BiCMOS pair of transistors for receiving said one of said respective bits of said digital input code and switching said constant current through said pull-up resistor in the event said one of said respective bits of said digital input code is logic high, and a second BiCMOS pair of transistors for receiving said inverted version of said one of said respective bits of said digital input code and switching said constant current to said relative positive power supply voltage in the event said inverted version of said one of said respective bits of said digital input code is logic high;

wherein said second BiCMOS pair of transistors further comprises:

(e) an additional resistor connected to said current cell;

(f) a bipolar transistor having a collector terminal connected to said relative positive power supply voltage, an emitter terminal connected to said current cell, and a base terminal connected to said additional resistor; and (g) a MOS transistor having a drain terminal thereof connected to said relative positive power supply voltage, a source terminal thereof connected to said additional resistor and said base terminal, and a gate terminal for receiving said inverted version of said one of said respective bits of said digital input code and in response selectively conducting said constant bit current from said relative power supply voltage through said additional resistor to said current cell via a drain-source channel of said MOS transistor, whereby the base-emitter junction of said bipolar transistor becomes forward biased causing a portion of said constant bit current to flow through said bipolar transistor to said current cell.

8. A current switch for use in a current-steering digital-to-analog converter, comprising:

(a) an input for receiving an input digital signal;

(b) an output resistor having first and second terminals, said first terminal being connected to a source of power supply voltage, for generating an output voltage proportional to current flowing therethrough;

(c) an inverter connected to said input for receiving an input digital signal and in response generating an inverted version thereof;

(d) a current cell for generating a constant bit current;

(e) a first BiCMOS pair of transistors connected to said input, said current cell, and said second terminal of said output resistor for receiving said input digital signal and in response switching to said constant current through said output resistor in the event said input digital signal is logic high; and (f) a second BiCMOS pair of transistors connected to said inverter, said current cell and said first terminal of said output resistor, for receiving said inverted version of said one of said input digital signal and in response switching said constant current to source of power supply voltage in the event said inverted version is logic high;

wherein said first BiCMOS pair of transistors further comprises:

(g) an additional resistor connected to said current cell;

(h) a bipolar transistor having a collector terminal connected to said second terminal of said output resistor, an emitter terminal connected to said current cell, and a base terminal connected to said additional resistor; and (i) a MOS transistor having a drain terminal thereof connected to said second terminal of said output resistor, a source terminal thereof connected to said additional resistor and said base terminal, and a gate terminal for receiving said input digital signal and in response selectively conducting said constant bit current through said output resistor and said additional resistor to said current cell via a drain-source channel of said MOS transistor, whereby the base-emitter junction of said bipolar transistor becomes forward biased causing a portion of said constant bit current to flow through said output resistor and said bipolar transistor to said current cell.

9. A current switch for use in a current-steering digital-to-analog converter, comprising:

(a) an input for receiving an input digital signal;

(b) an output resistor having first and second terminals, said first terminal being connected to a source of power supply voltage, for generating an output voltage proportional to current flowing therethrough;

(c) an inverter connected to said input for receiving an input digital signal and in response generating an inverted version thereof;

(d) a current cell for generating a constant bit current;

(e) a first BiCMOS pair of transistors connected to said input, said current cell, and said second terminal of said output resistor for receiving said input digital signal and in response switching said constant current through said output resistor in the event said input digital signal is logic high; and (f) a second BiCMOS pair of transistors connected to said inverter, said current cell and said first terminal of said output resistor, for receiving said inverted version of said one of said input digital signal and in response switching said constant current to source of power supply voltage in the event said inverted version is logic high;

wherein said second BiCMOS pair of transistors further comprises:

(g) an additional resistor connected to said current cell;

(h) a bipolar transistor having a collector terminal connected to said power supply voltage, an emitter terminal connected to said current cell, and a base terminal connected to said additional resistor; and (i) a MOS transistor having a drain terminal thereof connected to said power supply voltage, a source terminal thereof connected to said additional resistor and said base terminal, and a gate terminal for receiving said inverted version of input digital signal and in response selectively conducting said constant bit current from said power supply voltage through said additional resistor to said current cell via a drain-source channel of said MOS transistor, whereby the base-emitter junction of said bipolar transistor becomes forward biased causing a portion of said constant bit current flow through said bipolar transistor to said current cell.

10. A self-calibrated current cell connected to relative positive and relative negative power supply voltages, comprising:

a) a source of constant reference current connected to said relative positive power supply voltage;

b) an output terminal;

c) a MOS transistor having a drain terminal connected to said relative positive power supply voltage, and gate and source terminals;

d) first switch means connected to said source of constant reference current;

e) second switch means connected to said output terminal and said first switch means;

f) third switch means connected to said gate terminal and said first and second switch means;

g) first circuit means configured as a level shifter and connected to said source terminal of said MOS transistor and to said relative negative power supply voltage; and h) second circuit means connected to said source terminal of said MOS transistor, to said first circuit means, to said relative negative power supply voltage and to said first, second and third switch means;

whereby (i) in response to said first and third switch means being closed and said second switch means being open said MOS transistor is enabled which in response enables said second circuit means for conducting said constant reference current, and (ii) in response to said first switch and third switch means then being opened and said second switch means being closed said MOS transistor remains enabled, said second circuit means conducts said constant reference current through said second switch means to said output terminal and said first circuit means is enabled for minimizing voltage variation at said output terminal in response to opening said first and third switch means and closing said second switch means.

11. The current cell of claim 10, wherein said first circuit means comprises i) a first resistor connected to said relative negative power supply voltage; and j) a first NPN transistor having a collector terminal connected to said source terminal of said MOS transistor, a base terminal connected to said collector terminal and an emitter terminal connected to said first resistor.

12. The current cell of claim 11, wherein said second circuit means comprises:

k) a second resistor connected to said relative negative power supply voltage;

l) a second NPN transistor having a collector terminal connected to said first, second and third switch means, a base terminal connected to said source terminal of said MOS transistor and said collector terminal of said first NPN transistor, and an emitter terminal connected to said second resistor; and m) a further current source connected in parallel with said second resistor and said second NPN transistor.

13. The current cell of claim 10, wherein said first circuit means comprises a first substrate parasitic bipolar transistor having a collector terminal connected to said relative negative power supply voltage, a base terminal connected to said second circuit means and an emitter terminal connected to said source terminal of said MOS transistor.

14. The current cell of claim 12, wherein said second circuit means comprises:

h) a first resistor connected to said relative positive power supply voltage;

i) a second substrate parasitic transistor having a collector terminal connected to said relative negative power supply voltage, a base terminal connected to said base terminal of said first substrate parasitic bipolar transistor, and an emitter terminal connected to said first resistor;

j) an operational amplifier having an output connected to the base terminal of said second substrate parasitic transistor, and inverting and non-inverting inputs, said inverting input being connected to said emitter terminal of said second substrate parasitic transistor;

k) a second MOS transistor having a drain terminal connected to said first, second and third switch means, a gate terminal connected to said emitter terminal of said first substrate parasitic bipolar transistor, and a source terminal connected to said relative negative power supply voltage;

l) a further current source connected to said relative positive power supply voltage; and m) a third MOS transistor having a drain terminal connected to said further current source, a gate terminal connected to the non-inverting input of said operational amplifier and a source terminal connected to said relative negative power supply voltage.

15. The current cell of claim 13, wherein said first substrate parasitic bipolar transistor is one of either a PNP transistor in an N-well CMOS process or an NPN transition in a P-well CMOS process.

16. The current cell of claim 14, wherein each of said first and second substrate parasitic transistors is one of either a PNP transistor in an N-well CMOS process or an NPN transistor in a P-well CMOS process.

17. The current-steering digital-to-analog converter of claim 4, wherein said first substrate parasitic bipolar transistor is one of either a PNP transistor in an N-well CMOS process or an NPN transition in a P-well CMOS process.

18. The current-steering digital-to-analog converter of claim 5, wherein said first and second substrate parasitic transistors is one of either a PNP transistor in an N-well CMOS process or an NPN transistor in a P-well CMOS process.

* * * * *

UNITED STATES PATENT AND TRADEMARK OFFICE
CERTIFICATE OF CORRECTION

PATENT NO. : 5,548,288
DATED : August 20, 1996
INVENTOR(S) : Bosco Leung

It is certified that error appears in the above-indentified patent and that said Letters Patent is hereby corrected as shown below:

On the title page, under item [19] and item [75]

change "Lueng" to --Leung --.

Signed and Sealed this

Tenth Day of December, 1996

Attest:

BRUCE LEHMAN

Attesting Officer

Commissioner of Patents and Trademarks